(12) United States Patent
Dussaigne et al.

(10) Patent No.: US 9,728,680 B2
(45) Date of Patent: Aug. 8, 2017

(54) OPTOELECTRONIC DEVICE COMPRISING MICROWIRES OR NANOWIRES

(71) Applicants: Commissariat à l'Energie Atomique et aux Energies Alternatives, Paris (FR); ALEDIA, Grenoble (FR)

(72) Inventors: Amélie Dussaigne, Bizonnes (FR); Alain Million, Grenoble (FR); Anne-Laure Bavencove, Grenoble (FR)

(73) Assignees: COMMISSARIAT A L'ENERGIE ATOMIQUE ET AUX ENERGIES, Paris (FR); ALEDIA, Grenoble (FR)

( * ) Notice: Subject to any disclaimer, the term of this patent is extended or adjusted under 35 U.S.C. 154(b) by 90 days.

(21) Appl. No.: 14/758,162

(22) PCT Filed: Dec. 27, 2013

(86) PCT No.: PCT/FR2013/053274
§ 371 (c)(1),
(2) Date: Apr. 1, 2016

(87) PCT Pub. No.: WO2014/102514
PCT Pub. Date: Jul. 3, 2014

(65) Prior Publication Data
US 2016/0204312 A1    Jul. 14, 2016

(30) Foreign Application Priority Data

Dec. 28, 2012 (FR) ..................... 12 62928

(51) Int. Cl.
*H01L 29/06* (2006.01)
*H01L 33/32* (2010.01)
(Continued)

(52) U.S. Cl.
CPC ........ *H01L 33/325* (2013.01); *H01L 31/0304* (2013.01); *H01L 31/03044* (2013.01);
(Continued)

(58) Field of Classification Search
CPC ..................... H01L 33/325; H01L 31/0304
(Continued)

(56) References Cited

U.S. PATENT DOCUMENTS

| 7,829,443 | B2 | 11/2010 | Seifert et al. |
| 2006/0098705 | A1* | 5/2006 | Wang ..................... B82Y 10/00 372/50.124 |

(Continued)

FOREIGN PATENT DOCUMENTS

| DE | 10 2010 012 711 A1 | 9/2011 |
| EP | 2 333 847 A1 | 6/2011 |

(Continued)

OTHER PUBLICATIONS

Bavencove, A-L, et al., "Submicrometre Resolved Optical Characterization of Green Nanowire-Based Light Emitting Diodes", Nanotechnology, vol. 22 No. 34, Jul. 28, 2011.
(Continued)

*Primary Examiner* — Jami M Valentine
(74) *Attorney, Agent, or Firm* — Howard IP Law Group, PC

(57) ABSTRACT

An optoelectronic device comprises microwires or nanowires, each of which comprises an alternation of passivated portions and of active portions, the active portions being surrounded with an active layer, where the active layers do not extend on the passivated portions.

20 Claims, 4 Drawing Sheets

(51) Int. Cl.
*H01L 31/0352* (2006.01)
*H01L 31/0304* (2006.01)
*H01L 33/00* (2010.01)
*H01L 33/04* (2010.01)
*H01L 33/08* (2010.01)
*H01L 33/18* (2010.01)
*H01L 33/24* (2010.01)
*H01L 31/0693* (2012.01)
*H01L 31/075* (2012.01)

(52) U.S. Cl.
CPC ............ *H01L 31/03529* (2013.01); *H01L 31/035227* (2013.01); *H01L 31/035236* (2013.01); *H01L 31/035281* (2013.01); *H01L 31/0693* (2013.01); *H01L 31/075* (2013.01); *H01L 33/0075* (2013.01); *H01L 33/04* (2013.01); *H01L 33/08* (2013.01); *H01L 33/18* (2013.01); *H01L 33/24* (2013.01); *H01L 33/32* (2013.01); *Y02E 10/544* (2013.01); *Y02E 10/548* (2013.01); *Y02P 70/521* (2015.11)

(58) Field of Classification Search
USPC .............................................. 257/13; 438/20
See application file for complete search history.

(56) References Cited

U.S. PATENT DOCUMENTS

| | | | | |
|---|---|---|---|---|
| 2008/0149944 | A1* | 6/2008 | Samuelson | B82Y 10/00 257/88 |
| 2009/0127540 | A1* | 5/2009 | Taylor | B82Y 10/00 257/14 |
| 2009/0294757 | A1* | 12/2009 | Wernersson | B82Y 10/00 257/14 |
| 2010/0006817 | A1* | 1/2010 | Ohlsson | B82Y 20/00 257/13 |
| 2011/0309382 | A1* | 12/2011 | Lowgren | B82Y 20/00 257/88 |
| 2012/0068153 | A1 | 3/2012 | Seong et al. | |
| 2012/0217474 | A1 | 8/2012 | Zang et al. | |
| 2013/0112945 | A1* | 5/2013 | Gilet | H01L 33/06 257/13 |
| 2013/0316491 | A1* | 11/2013 | Carroll | G02B 6/06 438/96 |
| 2014/0077156 | A1* | 3/2014 | Bavencove | H01L 27/153 257/13 |
| 2016/0204307 | A1* | 7/2016 | Robin | H01L 33/06 257/13 |

FOREIGN PATENT DOCUMENTS

| | | |
|---|---|---|
| FR | 2 964 796 A1 | 9/2010 |
| WO | 2010/005381 A1 | 1/2010 |
| WO | 2012/054477 A2 | 4/2012 |
| WO | 2012/156620 A2 | 11/2012 |

OTHER PUBLICATIONS

Robin, I.C., et al., "Growth and Characterization of ZnO Nanowires on P-type GaN", Microelectronics Journal vol. 40 No. 2, Feb. 2, 2009.

Gu, Anjia, et al., Design and Growth of III-V Nanowire Solar Cell Arrays on Low Cost Substrates, 35th IEEE Photovoltaic Specialists Conference (PVSC), Jun. 20-25, 2010.

Bavencove, A-L, et al., "Light Emitting Diodes Based on GaN Core/Shell Wires Grown by MOVPE on N-type Si Substrate", Electronics Letters, The Institution of Engineering and Technology, vol. 47, No. 13, Jun. 23, 2011.

International Search Report for International Application PCT/FR2013/053274 dated Feb. 19, 2014.

* cited by examiner

OPTOELECTRONIC DEVICE COMPRISING MICROWIRES OR NANOWIRES

CROSS REFERENCE TO RELATED APPLICATIONS

The present patent application is the national stage application under 35 U.S.C. §371 of International Application No. PCT/FR2013/053274 filed Dec. 27, 2013 with priority claim to French patent application FR12/62928 filed Dec. 28, 2012, the entire disclosures of which are incorporated herein by reference in their entireties.

BACKGROUND

The present disclosure generally relates to optoelectronic devices comprising semiconductor microwires or nanowires and to methods of manufacturing the same.

Term "optoelectronic devices" is used to designate devices capable of converting an electric signal into an electromagnetic radiation or the other way, and especially devices dedicated to detecting, measuring, or emitting an electromagnetic radiation or devices dedicated to photovoltaic applications.

DISCUSSION OF THE RELATED ART

The improvement of optoelectronic devices with microwires or nanowires of radial type, also called core/shell microwires or nanowires, comprising an active area formed at the periphery of a microwire or nanowire, is here more specifically considered.

The microwires or nanowires considered herein comprise a semiconductor material mainly comprising a group-III element and a group-V element (for example, gallium nitride GaN), called III-V compound hereafter.

Such devices are for example described in unpublished French patent applications No. 12/58729 filed on Sep. 18, 2012 and No. 12/60232 filed on Oct. 26, 2012.

SUMMARY

Thus, an optoelectronic device comprising microwires or nanowires, each of which comprises an alternation of passivated portions and of active portions, the active portions being surrounded with an active layer, where the active layers do not extend on the passivated portions, is provided herein.

According to an embodiment, the heights of the active portions are different.

According to an embodiment, the heights of the active portions are equal.

According to an embodiment, at least one of the active portions has a height greater than or equal to 4 μm.

According to an embodiment, at least one of the active portions has a height smaller than 5 μm.

According to an embodiment, the height of each passivated portion interposed between two active portions is in the range from 200 nm to 10 μm.

According to an embodiment, each passivated portion is surrounded with a layer of dielectric material having a thickness in the range from one atomic monolayer to 10 nm.

According to an embodiment, the passivated and active portions have the same mean diameter.

According to an embodiment, the passivated and active portions have different diameters.

According to an embodiment, the passivated portions comprises a doped III-V compound, the active portions mainly comprising a III-V compound which is undoped or less heavily doped than the passivated portions.

According to an embodiment, the III-V compound is a III-N compound, particularly selected from the group comprising gallium nitride, aluminum nitride, indium nitride, gallium indium nitride, gallium aluminum nitride, aluminum indium nitride, and gallium aluminum indium nitride.

According to an embodiment, the III-V compound is gallium nitride and the dopant of the doped III-V compound is silicon.

According to an embodiment, the portion most distant from the support is a passivated portion.

According to an embodiment, each active layer comprises a multiple quantum well or single layer structure.

A method of manufacturing an optoelectronic device such as previously described is also provided, wherein the passivated portions are formed in a reactor with first proportions of precursors of III-V compounds and a dopant such as silicon, and the active portions are formed in the same reactor in different growth conditions and with a dopant ratio smaller than that of the passivated portions or equal to zero.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
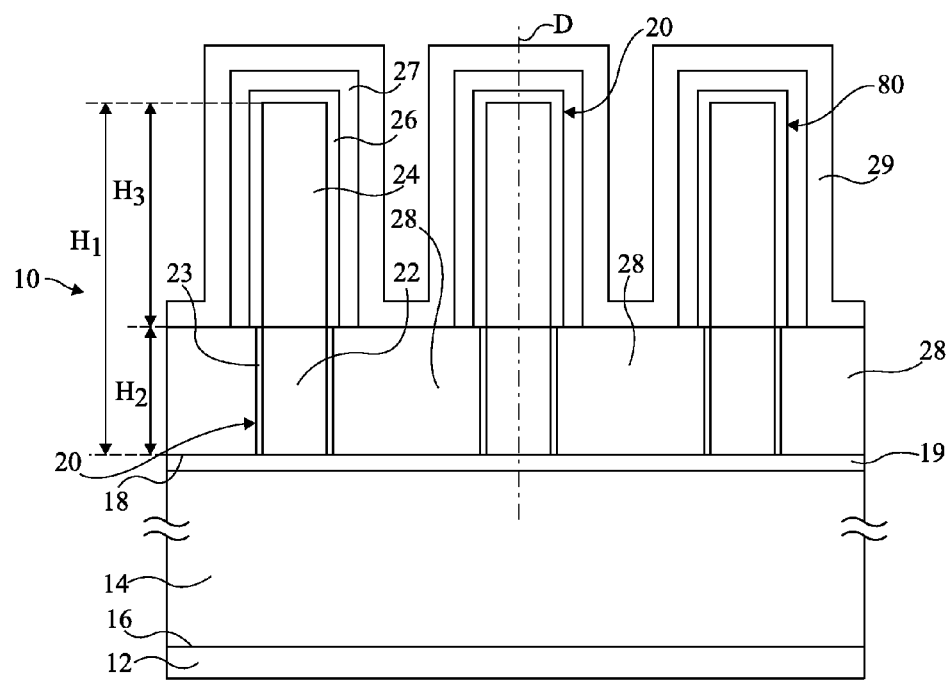
FIG. 1 is a partial simplified cross-section view of an example of an optoelectronic device with microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the optoelectronic device control means described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

Term "microwire" or "nanowire" designates a three-dimensional structure having an elongated shape along a preferred direction, having at least two dimensions, called minor dimensions, in the range from 5 nm to 2.5 μm, the third dimension, called major dimension, being at least equal to 1 time, preferably at least 5 times, and more preferably still at least 10 times, the largest of the minor dimensions. In certain embodiments, the minor dimensions may be smaller than or equal to approximately 1,000 nm, preferably in the range from 100 nm to 1 µm, and more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferential direction of the wire, is substantially rectilinear and is called "axis" of the wire hereafter.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the cross-section of the wire.

The wires may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

In certain embodiments, the wires may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The fact of saying that a compound based on at least one first element and on a second element has a polarity of the first element and a polarity of the second element means that the material grows along a preferred direction and that when the material is cut in a plane perpendicular to the preferred growth direction, the exposed surface essentially comprises atoms of the first element in the case of the polarity of the first element or the atoms of the second element in the case of the polarity of the second element.

The wires are formed on a surface of a substrate. The substrate may correspond to a one-piece structure or correspond to a layer covering a support made of another material. The substrate for example is a semiconductor substrate such as a substrate made of silicon, germanium, silicon carbide, a III-V compound, such as GaN or GaAs, or a ZnO substrate. The substrate may be made of a conductive material, for example, of metal, or of an insulating material, for example, of sapphire, glass, or ceramic. Preferably, the substrate is made of silicon, particularly of single-crystal silicon or polysilicon.

A treatment may be applied to the substrate to promote the wire growth, particularly at determined locations. Further, the treatment may promote the wire growth according to a given polarity. An example of treatment comprises covering the substrate with a layer, called nucleation layer, of a material promoting the wire growth. Another example of treatment comprises depositing on the substrate or on the nucleation layer a layer of a dielectric material, forming openings in the layer of dielectric material to expose portions of the substrate or of the nucleation layer, and growing wires on the exposed portions of the substrate or nucleation layer, as described in document U.S. Pat. No. 7,829,443. Another example of treatment comprises depositing on the substrate a layer comprising portions of a material, each promoting the growth of a wire of a III-V compound according to the polarity of the group-V element separated by a region of a material promoting the growth of the III-V compound according to the polarity of the group-III element, as described in unpublished patent application No. 12/58729. Another example of treatment comprises forming, on the substrate, pads of a material promoting the growth of wires and performing a treatment for protecting the portions of the surface of the substrate which are not covered by the pads to prevent the growth of wires, as described in unpublished patent application No. 12/60232.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. However, electrochemical processes may be used, for example, chemical bath deposition (CBD), hydrothermal processes, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethyl-indium (TMIn), or trimethylaluminum (TMAl). Examples of precursors of group-V elements are ammonia ($NH_3$), tertiarybutyl-phosphine (TBP), arsine ($AsH_3$), or dimethylhydrazine (UDMH).

According to an embodiment of the invention, in certain phases of growth of the wires of the III-V compound, a precursor of an additional element is added in excess, in addition to the precursors of the III-V compound. The additional element may be silicon (Si). An example of a precursor of silicon is silane ($SiH_4$). The presence of the precursor of the additional element results in incorporating the additional element in the III-V compound to dope this III-V compound, but also in the forming of a layer of a dielectric material mainly formed of the additional element and the group-V element on the lateral sides of the growing crystals of the III-V compound. The concentration of the additional element in the III-V compound is in the range from $10^{18}$ to $10^{21}$ atoms/cm$^3$, for example, in the order of $10^{20}$ atoms/cm$^3$. The layer of dielectric material has a thickness in the range from one atom monolayer to 10 nm. In the case where the III-V compound is GaN and the additional element is silicon, the GaN is heavily N-type doped and will here be called n$^+$GaN and the layer of dielectric material is silicon nitride SiN, of general formula $Si_xN_y$, where x and y are numbers between 1 and 4, for example, in stoichiometric form $Si_3N_4$.

FIG. 1 is a partial simplified cross-section view of an optoelectronic device 10 formed from wires such as previously described and capable of emitting or receiving an electromagnetic radiation.

Device 10 comprises, from bottom to top in FIG. 1:
a first biasing electrode 12;
a substrate 14, for example, semiconductor, comprising parallel surfaces 16 and 18, surface 16 being in contact with electrode 12 and surface 18 being treated to promote the growth of wires in organized fashion, particularly in one of the above-described manners. This treatment is schematically shown in FIG. 1 by a region 19 at the surface of substrate 14;

wires 20 (three wires being shown) of height $H_1$, each wire comprising a lower portion 22 of height $H_2$, in contact with surface 18, and an upper portion 24 of height $H_3$;

a passivating layer 23 covering the periphery of each lower portion 22;

an active layer 26 covering each upper portion 24;

a semiconductor layer 27 covering each active layer 26;

insulating portions 28 covering surface 18 between wires 20 at least up to height $H_2$; and a second electrode layer 29 covering semiconductor layers 27 and insulating portions 28.

Substrate 14 for example is a semiconductor substrate, such as a silicon substrate. Substrate 14 may be doped with a first conductivity type, for example, N-type doped.

Surface 16 may be treated to allow the forming of a good electric contact with electrode 12, preferably of ohmic type and with a low contact resistance.

Electrode 12 may correspond to a conductive layer which extends on surface 16 of substrate 14. The material forming electrode 12 is, for example, nickel silicide (NiSi), aluminum (Al), aluminum silicide (AlSi), titanium (Ti), or titanium silicide (TiSi). This layer may be covered with another metal layer, for example, gold, copper, or eutectics (Ti/Ni/Au or Sn/Ag/Cu) in the case of a soldering.

Each wire 20 is a semiconductor structure elongated along an axis D substantially perpendicular to surface 18. Each wire 20 may have a general elongated cylindrical shape with a hexagonal base. The mean diameter of each wire 20 may be in the range from 50 nm to 2.5 μm and height $H_1$ of each wire 20 may be in the range from 1 μm to 50 μm. The axes of the two adjacent wires may be distant by from 0.5 μm to 10 μm, and preferably from 1 to 3 μm.

Lower portion 22 of each wire 24 is mainly formed of a III-N compound, for example, gallium nitride, doped with a first conductivity type, for example, with silicon. The periphery of lower portion 22 is covered with dielectric layer 23, for example SiN, up to height $H_2$. Height $H_2$ may be in the range from 500 nm to 25 μm. Dielectric material layer 23 has a thickness in the range from one atomic monolayer to 10 nm.

Upper portion 24 of each wire is for example at least partly made of a III-N compound, for example, GaN. Upper portion 24 may be doped with the first conductivity type, for example, type N, or may not be intentionally doped.

In the case of a wire mainly made of GaN, the crystal structure of the wire may be of wurtzite type, the wire extending along axis C.

Active layer 26 is the layer from which most of the radiation provided by device 10 is emitted or where most of the radiation is captured by the device. According to an example, active layer 26 may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

Semiconductor layer 27 enables to form a P—N or P—I—N junction with active layer 26 and/or upper portion 24. It enables to inject holes into active layer 26 via electrode 29. Semiconductor layer 27 is for example at least partly formed in a III-N compound, for example, doped GaN of a conductivity type opposite to that of portions 22 and 24, for example, P-type doped.

Between active layer 26 and semiconductor layer 27, at least one interface layer, not shown, may be provided, that is, an electron barrier layer formed of a ternary alloy, for example, of gallium aluminum nitride (AlGaN) or of indium aluminum nitride (AlInN) of the same conductivity type as semiconductor layer 27.

Insulating portions 28 are for example made of silicon oxide or of silicon nitride.

Second electrode 29 is capable of ensuring the electric biasing of each P-N junction and of letting through the electromagnetic radiation emitted or received by the device. The material forming electrode 29 may be a transparent conductive material such as indium tin oxide (ITO), or aluminum zinc oxide.

The device described in FIG. 1 operates properly but has various disadvantages, particularly due to the fact that active layer 26 tends not to uniformly form on the lateral sides of the portion of wire 24 all along height $H_3$. In particular, in the case where active layer 26 comprises InGaN layers, a variation of the indium concentration in the InGaN layers along the radial portion of the active layer and/or a variation of the thickness of the InGaN layers along the radial portion of the active layer can be observed. This translates as a variation of the wavelength of the radiation emitted along the radial portion of the active layer. More specifically, the radial portion of each InGaN layer is thicker at its ends than at the central portion. Further, the indium concentration is higher at the ends than in the central portion of the radial portion of each InGaN layer. This translates as a higher wavelength of the emitted radiation at the ends than in the central portion of the radial portion of each active layer 26. For example, for a height $H_3$ in the order of 5 μm, and an active layer comprising multiple quantum wells comprising an alternation of GaN and of InGaN layers having respective targeted thicknesses of 8 nm and of 2.5 nm in average, the inventors have observed that, in the radial portion of each InGaN layer, the indium concentration is lower in the central portion than at the ends and that the thickness is close to 2 nm in the central portion and to 3.5 nm at the ends, which corresponds to an emission wavelength of approximately 400 nm in the central portion and of 450 nm at the ends.

It is difficult in this case to obtain a narrow emission or absorption spectrum around a single wavelength.

This difficulty is further increased by the fact that the wavelength of the radiation emitted at the axial end of the active layer is generally higher than that emitted in the radial portion, particularly due to the fact that the growth of the layers on the top and on the lateral sides of upper portion 24 occurs on different crystallographic planes.

However, the optoelectronic device of FIG. 1 does not enable either to obtain an emission or absorption spectrum which is wide and uniform, in particular close to that of white light, since the emission wavelengths and the contributions of the different portions of the active layer to the total spectrum cannot be selected independently from one another.

Thus, an object of an embodiment is to overcome all or part of the disadvantages of optoelectronic devices, particularly with microwires or nanowires, and of their previously-described manufacturing methods.

Another object of an embodiment is for the optoelectronic device with microwires or nanowires to have a wide and uniform spectrum or a narrow emission or absorption spectrum.

Another object of an embodiment is to increase the emission or absorption quality of the optoelectronic device with microwires or nanowires.

The inventors have shown that when the height of an active portion is smaller than a height threshold of approximately $H_S$, the phenomena of thickness inequality and/or of inequality of the concentration of elements of the active layer are substantially not significant, so that the emission or absorption wavelength is substantially constant along the active layer. The inventors have shown that when the height of an active portion is greater than height threshold $H_S$, the phenomena of thickness inequality and/or of inequality of the concentration of elements of the active layer are significant enough for the emission or absorption wavelengths to vary by more than 1% along the radial portion of the active layer, this percentage increasing with the length of the active portion.

Height threshold $H_S$ particularly depends on the diameter of the wire, on the height thereof, on the wire density, on the wire growth conditions, on the materials forming the wires, and on the orientation of the planes having the active layers formed thereon.

Preferably, height threshold $H_S$ is in the range from 0.1 µm to 10 µm. For the assembly formed of a GaN wire covered with active layers based on InGaN having an average diameter of approximately 2 µm, height threshold $H_S$ is in the range from 4 to 5 µm.

In the embodiments described hereafter, each wire comprises an alternation of passivated portions and of active portions. This is obtained by adding, in certain phases of growth of the wires of the III-V compound, a precursor of an additional element in excess to the precursors of the III-V compound. The presence of the precursor of the additional element results in the forming of a layer of a dielectric material on the lateral sides of the growing crystals of the III-V compound, which enables to obtain a passivated portion. In the case where the III-V compound is GaN, the additional element may be silicon.

Figure 2:
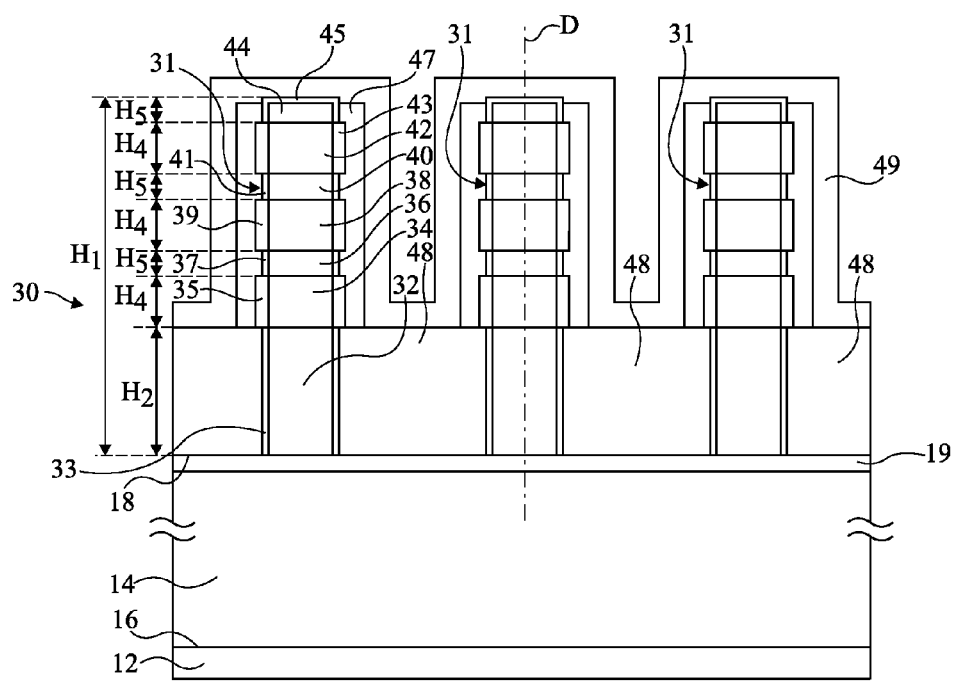
FIGS. 2 and 3 are partial simplified cross-section views of embodiments of an optoelectronic device comprising microwires or nanowires.

FIG. 2 shows an embodiment of an optoelectronic device 30. This device is developed from wires 31, each comprising an alternation of passivated portions and of active portions, the various active portions all having a height smaller than height threshold $H_S$.

Optoelectronic device 30 of FIG. 2 comprises wires 31 of axis D and formed of successive portions, from bottom to top:

a lower passivated portion 32 along a height $H_2$, covered with a passivating layer 33;

a first portion 34, called "active portion";

a second passivated portion 36, coated with a passivating layer 37;

a second active portion 38;

a third passivated portion 40, coated with a passivating layer 41;

a third active portion 42; and a fourth passivated portion 44, coated with a passivating layer 45.

FIG. 2 shows three active portions 34, 38, 42. However, device 30 may comprise a single active portion having a height smaller than $H_S$, two active portions or more than three active portions.

Each active portion 34, 38, 42 may have the same structure as previously-described active portion 24. Each passivated portion 32, 36, 40, and 44 may have the same structure as previously-described lower portion 22. Further, each passivating layer 33, 37, 41, and 45 may have the same structure as previously-described passivating layer 23.

Each active portion 34, 38, 42 has a height $H_4$, for example in the range from 300 nm to 4 µm, and each passivated portion 36, 40, 44 has a height $H_5$, for example, in the range from 200 nm to 10 µm. The sum of the heights of active portions 34, 38, 42 and of passivated portions 36, 40, 44 is in the range from 1 µm to 50 µm, for example, approximately 5 µm. Active portions 34, 38, 42 may have the same height as shown in FIG. 2. As a variation, active portions 34, 38, 42 may have different heights. However, in the present embodiment, the heights of active portions 34, 38, 42 are all smaller than or equal to height threshold $H_S$. Similarly, passivated portions 36, 40, 44 of height $H_5$ may have the same height as shown in FIG. 2. As a variation, the heights may be different.

Active portions 34, 38, 42 are coated with active layers, respectively 35, 39, 43. Each active layer 35, 39, 43 may be similar to previously-described active layer 26. A semiconductor layer 47 covers active layers 35, 39, 43. Semiconductor layer 47 may have the structure of previously-described layer 27. Insulating portions 48 cover surface 18 between wires 31 along at least height $H_2$ and may have the structure of previously-described insulating portions 28. A second electrode layer 49 covers semiconductor layers 47 and insulating portions 48. Second electrode 49 may have the structure of previously-described electrode 29.

Due to the small heights of active portions 34, 38, 42, active layers 35, 39, 43 are deposited with substantially uniform thicknesses and/or concentrations of elements along the entire height of each active portion 34, 38, 42. Particularly, in the case where each active layer comprises a quantum well structure comprising an alternation of GaN and InGaN or a single InGaN layer, the proportion of indium is substantially uniform along the entire height of each active layer 35, 39, 43.

As a result, the emission wavelengths associated with active layers 35, 39, 43 formed on active portions 34, 38, 42 are substantially uniform for each active layer 35, 39, 43. For example, in the case of active layers based on multiple quantum wells comprising an alternation of InGaN layers and of GaN layers, each active layer 35, 39, 43 formed on one of active portions 34, 38, 42 of a diameter, for example, of approximately 2.5 µm, emits at a wavelength of approximately 440 nm, which corresponds to a blue color. An accurately-controlled narrow emission spectrum can thus be obtained.

Further, since there is no active layer at the top of each wire 31 which comprises a passivated portion 44, there is no radiation emission at a different wavelength at the top of each wire 31.

According to another embodiment, advantage is taken from the fact that the active layer deposit may be different from one active portion to the other according to the positions of the active portions on the wire, for example according to whether the active portion is close to the base of the wire or close to the top of a wire of large height, particularly greater than 5 µm for a 2-µm wire diameter. Thus, the number of active portions per wire and the height of each of them may be selected to obtain the final desired emission or absorption spectrum. In particular, a wide-band emission spectrum which is substantially uniform or close to the spectrum of white light can thus be obtained.

Figure 3:
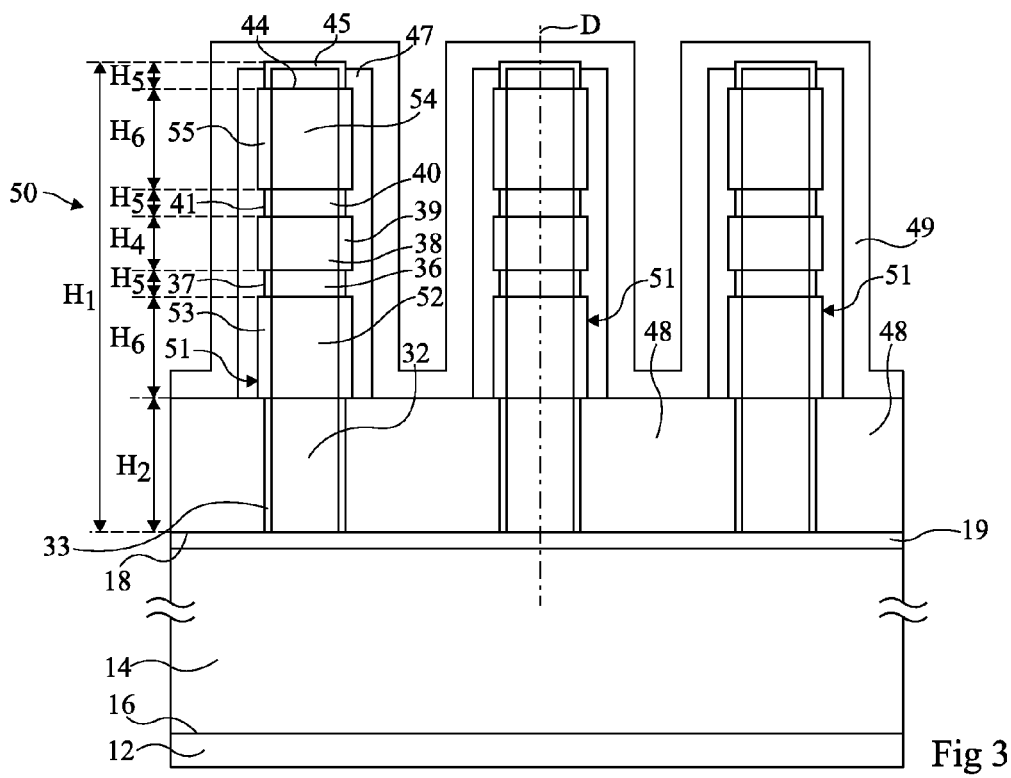

FIG. 3 shows another embodiment of an optoelectronic device 50. This device is developed from wires 51, each comprising an alternation of passivated portions and of active portions, at least one of the various active portions having a height greater than height threshold $H_S$. All the active portions may have a height greater than height threshold $H_S$. However, preferably, at least another one of the active portions has a height smaller than height threshold $H_S$.

Device 50 comprises all the elements of optoelectronic device 30 shown in FIG. 2, with the difference that active portions 34 and 42 of FIG. 2 are replaced with active portions 52 and 54 of height $H_6$, each covered with an active layer 53, 55. As an example, height $H_6$ is strictly greater than height $H_4$, preferably greater than 1.5 times height $H_4$. Height $H_6$ is for example in the range from 5 to 7 µm.

FIG. 3 shows three active portions 52, 38, 54. However, device 50 may comprise a single active portion, two active portions, or more than three active portions.

In this embodiment, height $H_6$ is preferably greater than the height threshold beyond which phenomena of thickness and/or active layer element concentration inequality can be observed. However, the number of active portions per wire and the height of each of them may be selected to obtain the final desired emission or absorption spectrum. In particular, a wide-band emission spectrum which is substantially uniform or close to the spectrum of white light can thus be obtained.

As an example, an emission spectrum characteristic of a white light may be obtained by using a wire comprising a first active portion having a height smaller than the height threshold and having an emission wavelength at 590 nm and a second active portion having a height greater than the height threshold and having a 460-nm emission wavelength in the central portion and a 530-nm emission wavelength at the ends.

FIGS. 4A to 4H illustrate the structures obtained at successive steps of an embodiment of a method of manufacturing optoelectronic device 30 of FIG. 2.

Figure 4A:
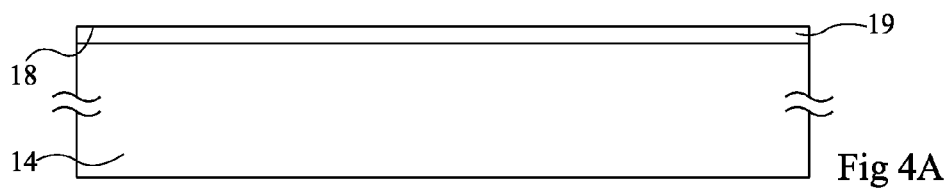
FIGS. 4A to 4H are partial simplified cross-section views of structures obtained at successive steps of another embodiment of the method of manufacturing the optoelectronic device of FIG. 2.
Figure 4B:
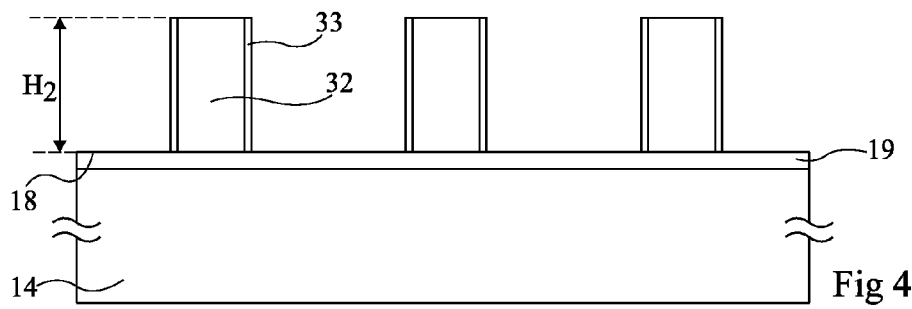
Figure 4C:
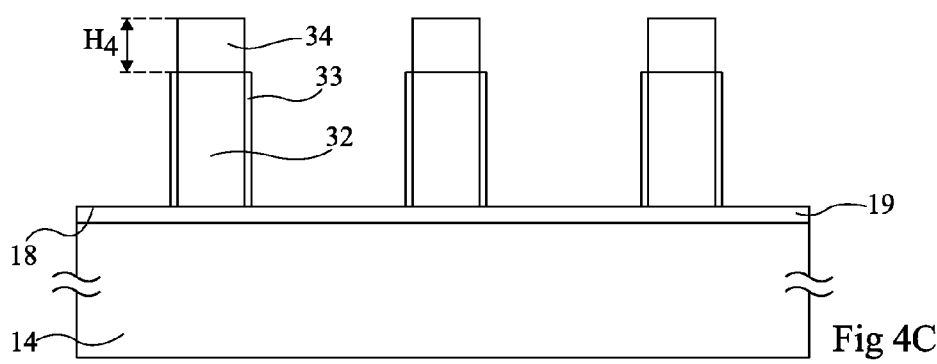
Figure 4D:
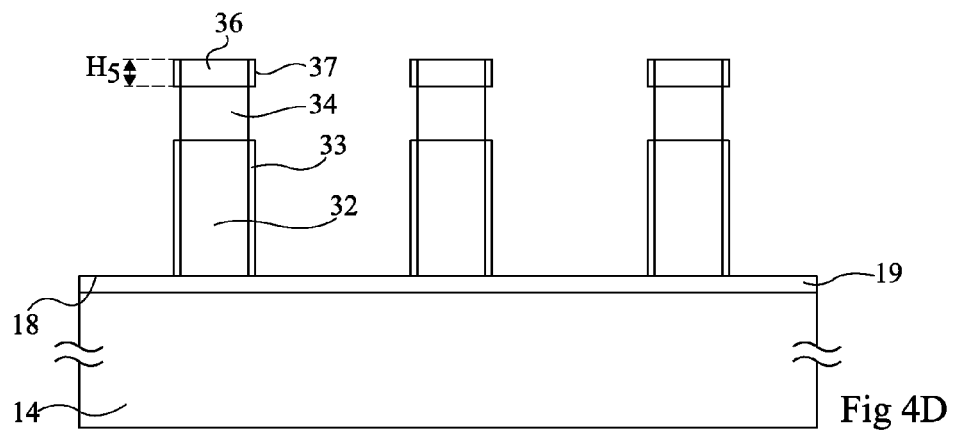
Figure 4E:
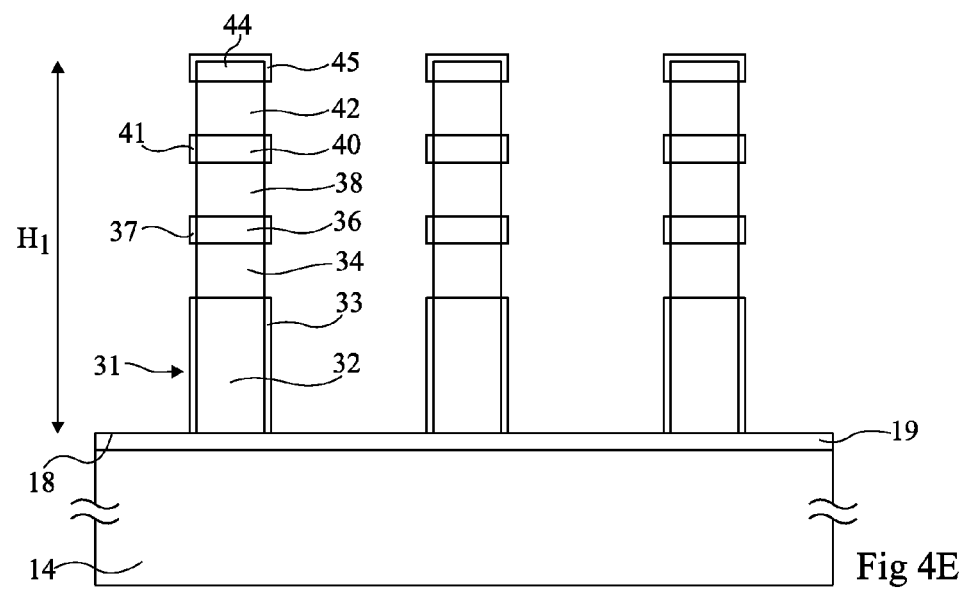

The manufacturing method comprises the steps of:

(1) Treating substrate 14 to promote the growth of wires of the III-V compound, for example, GaN, at preferred locations. This treatment is schematically shown by the forming of seed layer 19 at the surface of substrate 14 (FIG. 4A). Step (1) may be absent. In this case, the wires may spontaneously grow on substrate 14.

(2) Growing passivated portion 32 of each wire (FIG. 4B) up to height $H_2$ from surface 18 of substrate 14. Portion 32 may be obtained by a MOCVD-type method. However, methods such as CVD, MBE, GSMBE, MOMBE, PAMBE, ALE, HVPE, or electrochemical methods may be used.

As an example, in the case where upper portion 32 is made of n+GaN, a MOCVD-type method may be implemented by injecting into a MOCVD reactor, of shower type, a gallium precursor gas, for example, trimethylgallium (TMGa) and a nitrogen precursor gas, for example, ammonia ($NH_3$). As an example, a showerhead-type 3×2" MOCVD reactor commercialized by AIXTRON may be used. A molecular flow ratio between trimethylgallium and ammonia within the 5-200 range, preferably within the 10-100 range, enables to promote the growth of wires. As an example, a carrier gas which ensures the diffusion of metal-organic elements all the way into the reactor charges with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used.

The presence of silane among the precursor gases causes the incorporation of silicon within the III-N compound. Further, this results in the forming of silicon nitride layer 33 which covers the periphery of portion 32 of height $H_2$, except for the top, as portion 32 grows.

(3) Growing active portion 34 of height $H_4$ of each wire (FIG. 4C) on the top of passivated portion 32. For the growth of active portion 34, the previously-described MOCVD reactor operating conditions are, as an example, maintained but for the fact that the silane flow in the reactor is decreased, for example, by a factor greater than or equal to 10, or stopped. Even when the silane flow is stopped, an active portion may be N-type doped due to the diffusion in this active portion of dopants originating from the adjacent passivated portions or due to the residual doping of GaN.

(4) Growing passivated portion 36 of each wire (FIG. 4D) of height $H_5$ on the top of active portion 34. The operating conditions of the MOCVD reactor previously described for the growth of passivated portion 32 are, as an example, implemented again for the growth of portion 36 passivated by passivating layer 37.

(5) Successively growing active portion 38, passivated portion 40, active portion 42, and passivated portion 44 (FIG. 4E) by repeating steps (3) and (4).

Figure 4F:
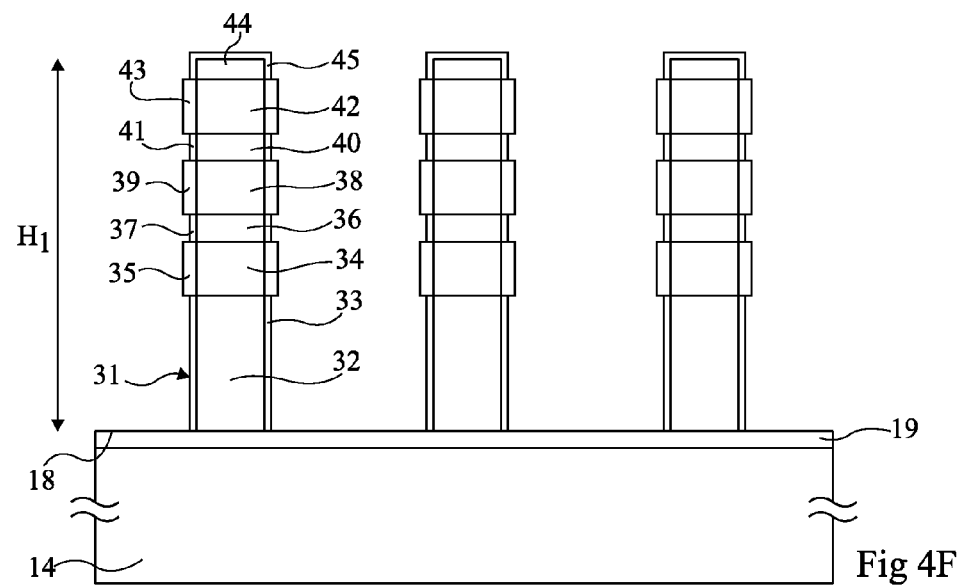

(6) Forming, by epitaxy, for each wire 31, active layers 35, 39, 43 (FIG. 4F). Given the presence of passivating layers 33, 37, 41, 45 on passivated portions 32, 36, 40, 44, the deposition of active layers 35, 39, 43 only occurs on active portions 34, 38, 42 of wire 31.

Figure 4G:
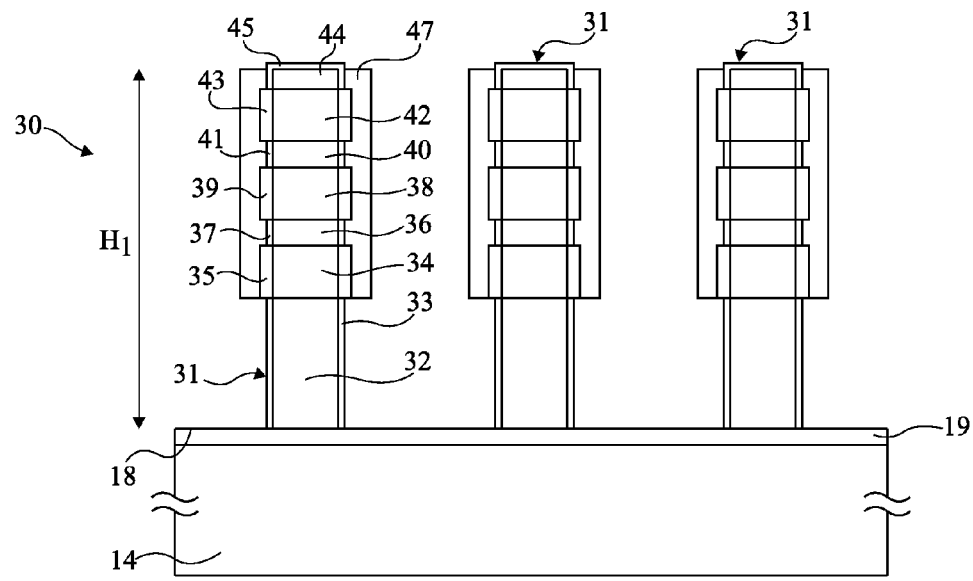

(7) Forming by epitaxy, for each wire 31, semiconductor layer 47 and, possibly, previously, the electron barrier layer (FIG. 4G). Although semiconductor layer 47 only grows on active layers 35, 39, 43 and does not directly grow on passivated portions 32, 36, 40, 44, the semiconductor layer portions may join to form a single semiconductor layer when the height of intermediate passivated portions 36, 40 is not too large.

Figure 4H:
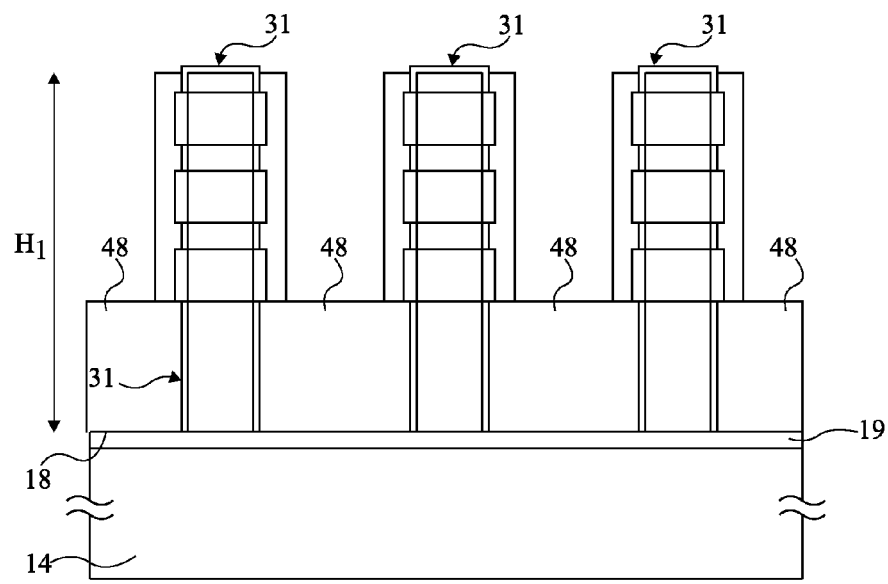

(8) Forming insulating portions 48 (FIG. 4H). Insulating portions 48 may be formed by conformally depositing an insulating layer over the entire structure shown in FIG. 4G, depositing a resin layer between wires 31, etching the insulating layer which is not covered with the resin to expose semiconductor layer 47, and removing the resin.

The method comprises additional steps of forming electrodes 12 and 49 for each wire 31.

The method of manufacturing optoelectronic device 50 may be similar to the method previously described in relation with FIGS. 4A to 4H, with the difference that the growth times of the active portions are modified.

Although the previously-described embodiments relate to III-V compounds, what has been described may also be implemented for the manufacturing of II-VI compounds (for example, zinc oxide ZnO) comprising a semiconductor material mainly comprising a group-II element and a group-VI element.

Further, embodiments where the wires, covered with a first electrode, are formed on a first surface of a support while a second electrode is formed on a second surface of the support, opposite to the first surface, have been shown in the drawings. It should however be clear that the second electrode may be provided on the side of the first surface.

Further, although, in the previously-described embodiments, each wire comprises a passivated portion 32 at the base of the wire in contact with surface 18, passivated portion 32 may be absent.

Further, although the previously described embodiments comprise insulating portions 28, 48 between the wires, the insulating portions may be absent.

Further, three active portions capable of being coated with active layers have been shown in FIGS. 2 and 3. This number of regions may be decreased or multiplied.

Further, while the different previously-described embodiments of optoelectronic devices are capable of emitting an electromagnetic radiation, such devices can easily be adapted by those skilled in the art to receive an electromagnetic radiation and convert it into an electric signal. Such an adaptation is performed by adapting both active layer 35, 39, 43, 53, 55 of each of wires 31, 51 and by applying an adequate biasing on the semiconductor structure. Such an adaptation of device 30, 50 may be performed to form either an optoelectronic device dedicated to measuring or detecting an electromagnetic radiation, or an optoelectronic device dedicated to photovoltaic applications.

What is claimed is:

1. An optoelectronic device comprising microwires or nanowires mainly comprising a III-V compound, each said microwire or nanowire comprising an alternation of passivated portions and of active portions, wherein the heights of the active portions are different, each active portion being surrounded, at the periphery thereof, with an active layer, where the active layers do not extend on the passivated portions, the active layers being the layers from which most of the radiation provided by the device is emitted or in which most of the radiation received by the device is captured.

2. The device of claim 1, wherein at least one of the active portions has a height greater than or equal to 4 µm.

3. The device of claim 1, wherein at least one of the active portions has a height less than 5 µm.

4. The device of claim 1, wherein the height of each passivated portion interposed between two active portions is in the range from 200 nm to 10 µm.

5. The device of claim 1, wherein each passivated portion is surrounded with a layer of dielectric material having a thickness in the range from one atomic monolayer to 10 nm.

6. The device of claim 1, wherein the passivated and active portions have the same average diameter.

7. The device of claim 1, wherein the passivated and active portions have different diameters.

8. The device of claim 1, wherein the passivated portions comprise a doped III-V compound, the active portions mainly comprising a III-V compound which is undoped or less heavily doped than the passivated portions.

9. The device of claim 8, wherein the III-V compound is a III-N compound, selected from the group consisting of: gallium nitride, aluminum nitride, indium nitride, gallium indium nitride, gallium aluminum nitride, aluminum indium nitride, and gallium aluminum indium nitride.

10. The device of claim 8, wherein the III-V compound is gallium nitride and the dopant of the doped III-V compound is silicon.

11. The device of claim 1, wherein each microwire or nanowire rests on a support and wherein, for each microwire or nanowire, the portion most distant from the support is a passivated portion.

12. The device of claim 1, wherein each active layer comprises a multiple quantum well or single layer structure.

13. A method of manufacturing the optoelectronic device of claim 1, wherein the passivated portions are formed in a reactor with first proportions of precursors of III-V compounds and a dopant, and wherein the active portions are formed in the same reactor in different growth conditions and with a dopant rate less than that of the passivated portions or equal to zero.

14. An optoelectronic device comprising microwires or nanowires mainly comprising a III-V compound, each said microwire or nanowire comprising an alternation of passivated portions and of active portions, each active portion being surrounded, at the periphery thereof, with an active layer, wherein the passivated and active portions have the same average diameter, where the active layers do not extend on the passivated portions, the active layers being the layers from which most of the radiation provided by the device is emitted or in which most of the radiation received by the device is captured.

15. The device of claim 14, wherein one of the passivated portions is disposed at the top of each microwire or nanowire.

16. The device of claim 14, wherein the passivated portions comprise a doped III-V compound, the active portions mainly comprising a III-V compound which is undoped or less heavily doped than the passivated portions.

17. The device of claim 16, wherein each microwire or nanowire is a GaN wire covered with active layers based on InGaN and having an average diameter of approximately 2 µm, wherein the heights of the active portions are less than 4 to 5 µm.

18. The device of claim 14, wherein the heights of the active portions are equal.

19. An optoelectronic device comprising microwires or nanowires mainly comprising a III-V compound, each said microwire or nanowire comprising an alternation of passivated portions and of active portions, each active portion being surrounded, at the periphery thereof, with an active layer, wherein the passivated portions comprise a doped III-V compound, the active portions mainly comprising a III-V compound which is undoped or less heavily doped than the passivated portions, where the active layers do not extend on the passivated portions, the active layers being the layers from which most of the radiation provided by the device is emitted or in which most of the radiation received by the device is captured.

20. The device of claim 14, wherein one of the passivated portions is disposed at the top of each microwire or nanowire.

* * * * *

UNITED STATES PATENT AND TRADEMARK OFFICE
CERTIFICATE OF CORRECTION

| | | |
|---|---|---|
| PATENT NO. | : 9,728,680 B2 | Page 1 of 1 |
| APPLICATION NO. | : 14/758162 | |
| DATED | : August 8, 2017 | |
| INVENTOR(S) | : Amélie Dussaigne, Alain Million and Anne-Laure Bavencove | |

It is certified that error appears in the above-identified patent and that said Letters Patent is hereby corrected as shown below:

On the Title Page

Assignee name should read:
Commissariat A L'Energie Atomique Et Aux Energies Alternatives, Paris (FR) and
Aledia, Grenoble (FR).

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*